United States Patent
Yamashita

(10) Patent No.: US 6,323,500 B1
(45) Date of Patent: Nov. 27, 2001

(54) ELECTRON-BEAM EXPOSURE SYSTEM

(75) Inventor: Hiroshi Yamashita, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/441,256

(22) Filed: Nov. 16, 1999

(30) Foreign Application Priority Data

Nov. 20, 1998 (JP) .................................................. 10-331790

(51) Int. Cl.[7] ........................ H01J 37/317; H01J 37/153; H01J 37/147; H01J 37/26
(52) U.S. Cl. .............................. 250/492.23; 250/492.22; 250/492.2; 250/492.1; 250/398
(58) Field of Search ............................ 250/492 P, 492.2, 250/492.22, 492.23, 492.3

(56) References Cited

U.S. PATENT DOCUMENTS

| | | | |
|---|---|---|---|
| 4,438,336 | * | 3/1984 | Riecke .................................. 250/398 |
| 5,973,333 | * | 10/1999 | Nakasuji et al. ................. 250/492.23 |
| 6,020,950 | * | 2/2000 | Shiraishi ................................ 355/30 |
| 6,166,387 | * | 12/2000 | Muraki ............................... 250/492.2 |

FOREIGN PATENT DOCUMENTS

| | | | |
|---|---|---|---|
| 2000-048762 | 2/2000 | (JP) | .............................. G01J/37/305 |
| 09-034103 | 2/1997 | (JP) | .................................. G03F/1/16 |
| 08-017714 | 1/1996 | (JP) | .............................. H01L/21/027 |
| 08-162389 | 6/1996 | (JP) | .............................. H01L/21/027 |
| 2000-012454 | 1/2000 | (JP) | .............................. H01L/21/027 |

* cited by examiner

*Primary Examiner*—Bruce Anderson
*Assistant Examiner*—Anthony Quash
(74) *Attorney, Agent, or Firm*—Hayes, Soloway, Hennessey, Grossman & Hage, P.C.

(57) ABSTRACT

An electron-beam exposure system is constructed using electromagnetic lenses, apertures and an electron-beam mask, which are arranged and aligned in line between an electron source and a substrate. Within a trajectory of an electron beam that is radiated from the electron source and is then irradiated onto the substrate, crossover planes emerge with respect to electrons of the electron beam. The electron-beam mask is arranged at one crossover plane, while the aperture is arranged at another crossover plane. In addition, one aperture is an object aperture that narrows down the electron beam in sectional shape and size. The electron source is designed to bring a specific electron-beam intensity distribution in which electrons corresponding to periphery in section of the electron beam is made higher in intensity than electrons corresponding to a center portion in section of the electron beam, wherein a zonal-annular projection portion is formed to surround a center portion of a radiation surface of the electron source. To perform oblique illumination in which the electron beam is incident on the substrate in an oblique manner, the system is equipped with a modified object aperture, at the crossover plane, which is constructed by a center shield member for cutting off electrons having small beam incident semi-angles and a ring opening portion for selectively transmitting electrons having large beam incident semi-angles. Thus, it is possible to reduce Coulomb effect, and it is possible to improve resolution and throughput in manufacture of integrated circuits.

15 Claims, 9 Drawing Sheets

ELECTRON-BEAM EXPOSURE SYSTEM

BACKGROUND OF THE INVENTION

1. Field of the Invention

This invention relates to electron-beam exposure systems that form fine patterns of integrated circuits on substrates such as semiconductor wafers, which are exposed to electron beams. Particularly, this invention relates to electron-beam exposure systems which are suitable for cell projection to obtain high throughputs.

This application is based on Patent Application No. Hei 10-331790 filed in Japan, the content of which is incorporated herein by reference.

2. Description of the Related Art

As compared with the conventional reduction projection techniques using ultraviolet radiation, electron-beam exposure techniques are advantageous in that very fine patterns can be formed on semiconductor wafers with high resolution. Recently, it is demanded that semiconductor devices such as memories should be manufactured with high throughputs. To cope with such a demand, the electron-beam exposure systems employ the cell projection using masks specifically designed for electron beams.

According to the cell projection, a part of a LSI pattern is repeatedly imaged on a substrate in accordance with an opening shape of an aperture. This system is advantageous particularly in manufacture of memory devices such as DRAMs (i.e., dynamic random-access memories), which contain plenty of repeated patterns, because a number of times to perform exposure can be remarkably reduced. So, as compared with the conventional variably shaped electron-beam exposure which exposes patterns in such a way that a picture is drawn with a single rectangular, it is possible to remarkably reduce a writing time.

An example of the conventional electron-beam exposure system will be described with reference to FIG. 9. Herein, an electron source 1 radiates an electron beam, a square shape of which is formed by a first aperture 2. The electron beam is converged by first and second electromagnetic lenses 3, 4. Then, the electron beam is irradiated onto an electron-beam mask 5 having an opening pattern 5a. The electron beam transmitted through the opening pattern 5a of the mask 5 is subjected to reduction and convergence by a third electromagnetic lens 6. Then, it is transmitted through an object aperture 7 and is subjected to convergence by an objective electromagnetic lens 8. Thus, the electron beam is finally irradiated on a surface of a semiconductor wafer W.

Incidentally, the electron source 1 of the conventional type is a square surface electron source as shown in FIGS. 10A and 10B, in which a radiation surface 1a of the electron beam is formed like a flat plane. Or, the conventional electron source employs another type of the radiation surface 1a whose a center portion is projected. In FIG. 9, opening portions of prescribed sizes are formed at center portions of the aforementioned apertures 2 and 7 to allow transmission of the electron beam. That is, the first aperture 2 has an opening portion 2a, while the object aperture 7 has an opening portion 7a.

The aforementioned electron-beam exposure technique suffers from problems, as follows:

In the cell projection, a pattern of a large area is imaged on the substrate at once. This increases a beam current being transmitted through the lenses and apertures. Increase of the beam current causes a so-called Coulomb effect to become large, so that an accuracy for formation of a beam shape is deteriorated due to repulsion being effected between electrons in response to an amount of the beam current. There is a disadvantage in which the beam is broadened in size so that resolution is reduced when the Coulomb effect becomes large. For this reason, it is impossible to increase the beam current so much. Therefore, it is difficult to improve the throughput. Conventionally, the electron beams radiated from the electron source have Gaussian distribution in distribution of electron-beam intensities which are distributed in connection with beam incident semi-angles of the electron beams being irradiated on the substrate. So, electrons are concentrated at a center portion of the section of the electron beam. Therefore, the Coulomb effect caused by increasing the beam current influences the conventional electron-beam exposure technique more badly as the beam incident semi-angle becomes smaller.

SUMMARY OF THE INVENTION

It is an object of the invention to provide an electron-beam exposure system which is capable of reducing the Coulomb effect and which is capable of improving resolution and throughput.

An electron-beam exposure system is constructed such that electromagnetic lenses, apertures and an electron-beam mask (or EB mask) are arranged and aligned in line between an electron source and a substrate such as a semiconductor wafer. Herein, an electron beam corresponding to electrons radiated from the electron source is subjected to convergence and reduction by the electromagnetic lenses while it is subjected to pattern formation by the EB mask having an opening pattern, thereafter, the electron beam is irradiated onto the substrate, so that prescribed patterns are imaged on the substrate to produce integrated circuits. Within a trajectory of the electron beam which progresses from the electron source to the substrate, there are formed three crossover planes of the electrons of the electron beam, for example. The EB mask is arranged at an object plane, while the aperture is arranged at a crossover plane. In addition, one aperture is designed as an object aperture that narrows down the electron beam in sectional shape and size.

The electron-beam exposure system of this invention is characterized by providing a specific electron-beam intensity distribution in which electrons corresponding to periphery of the section of the electron beam is made higher in intensity than electrons corresponding to a center portion of the section of the electron beam. So, the electron source is designed such that a zonal-annular projection portion is formed to surround a center portion of a radiation surface. Or, it is designed such that multiple unit projections are formed to surround the center portion of the radiation surface.

To perform oblique illumination in which the electron beam is incident on the substrate in an oblique manner, the system is equipped with a modified object aperture, at the crossover plane, which is constructed by a center shield member for cutting off electrons having small beam incident semi-angles and a ring opening portion for selectively transmitting electrons having large beam incident semi-angles.

Thus, it is possible to reduce Coulomb effect by increasing an average distance between the electrons within the electron beam. In addition, it is possible to improve resolution as well as throughput in manufacture of integrated circuits on the semiconductor wafer.

BRIEF DESCRIPTION OF THE DRAWINGS

These and other objects, aspects and embodiment of the present invention will be described in more detail with reference to the following drawing figures, of which.

DESCRIPTION OF THE PREFERRED EMBODIMENTS

This invention will be described in further detail by way of examples with reference to the accompanying drawings.

With reference to FIGS. 1, 2A, 2B and 3, a description will be given with respect to an electron-beam exposure system in accordance with embodiment 1 of the invention.

Figure 1:
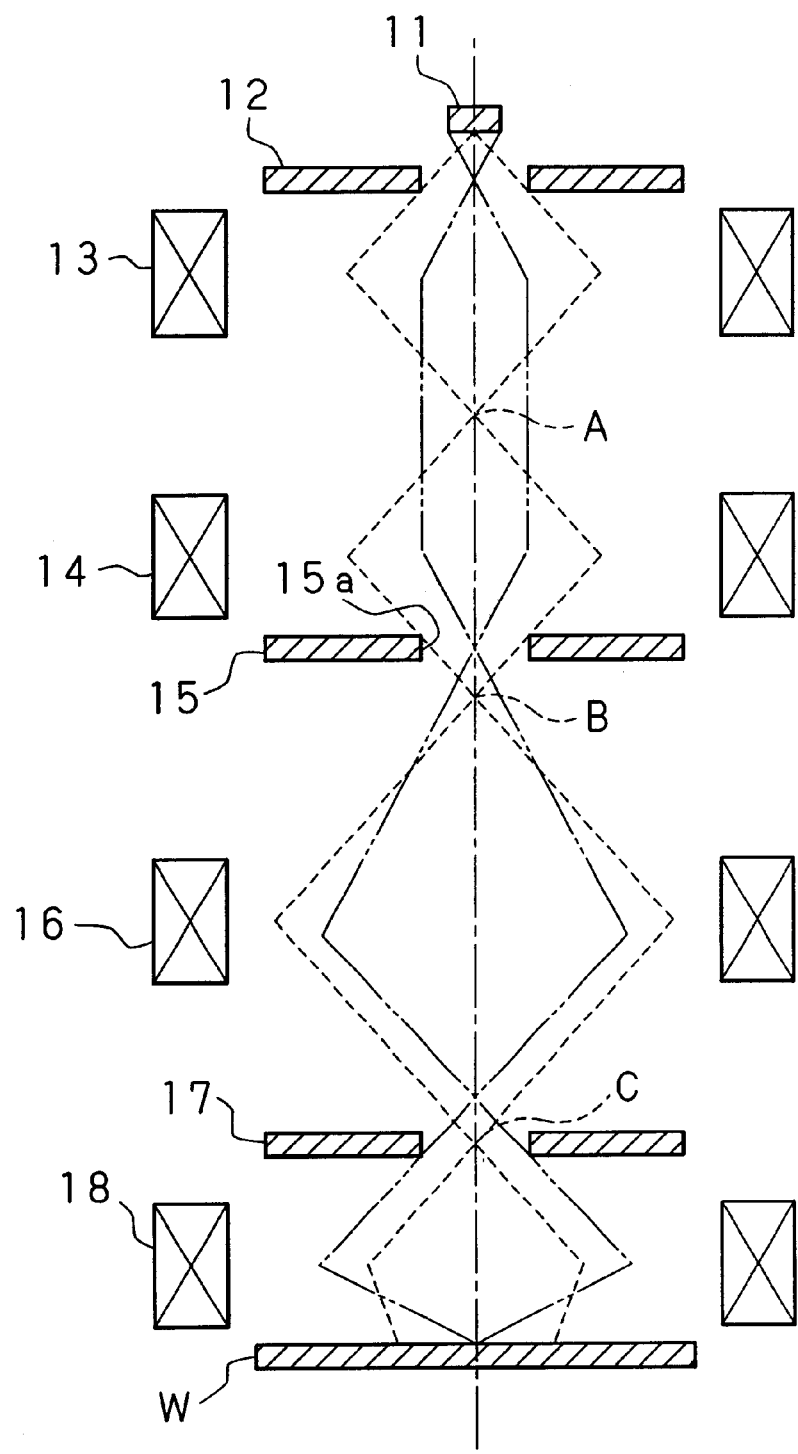
FIG. 1 is an exploded elevational view partially in section showing an electron-beam exposure system in accordance with embodiment 1 of the invention.

The electron-beam exposure system of FIG. 1 is configured by an electron source 11, a first aperture 12, a first electromagnetic lens 13, a second electromagnetic lens 14, an electron-beam mask (or EB mask) 15, a third electromagnetic lens 16, an object aperture 17 and a fourth electromagnetic lens 18.

In the electron-beam exposure system of the embodiment 1 shown in FIG. 1, the electron source 11 radiates an electron beam, a sectional shape of which is regulated in a rectangular shape by the first aperture 12. The first electromagnetic lens 13 uses first aperture 12 as a first object plane, so that the electron beam whose sectional shape is regulated by the first aperture 12 is converted to a parallel beam. The parallel beam made by the first electromagnetic lens 13 is subjected to convergence by the second electromagnetic lens 14, which provides a converged electron beam. An opening pattern 15a formed at a center portion of the EB mask 15 forms the converged electron beam with a predetermined pattern. Then, the electron beam being transmitted through the opening pattern 15a of the EB mask 15 is subjected to convergence and reduction by the third electromagnetic lens 16. The object aperture 17 acts as a limiting aperture which narrows down the electron beam which is converged and reduced by the third electromagnetic lens 16. Then, the electron beam, which is narrowed down in size and shape by the object aperture 17, is subjected to convergence by the fourth electromagnetic lens 18 which acts as an objective lens. Thus, the electron beam converged by the fourth electromagnetic lens 18 is irradiated on a surface of a semiconductor wafer (or substrate) W.

Incidentally, dotted lines in FIG. 1 show the electron-beam trajectory of the crossover, while reference symbols A, B and C show first, second and third crossover planes of the electrons respectively.

Figure 2A:
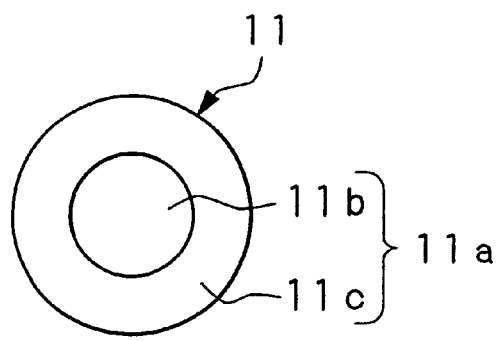
FIG. 2A is a front view showing a radiation surface of an electron source shown in FIG. 1.
Figure 2B:
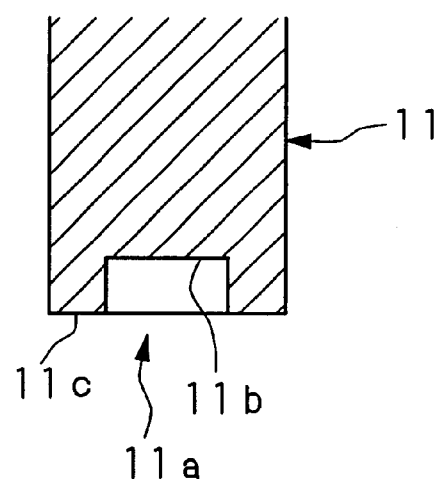
FIG. 2B is a cross sectional view of the electron source of FIG. 2A.

The electron source 11 is formed by a crystal of $LaB_6$, for example. As shown in FIGS. 2A and 2B, the electron beam 11 has a radiation surface 11a for radiating an electron beam at a tip end portion thereof Herein, the radiation surface 11a has a center portion 11b, which is surrounded by a zonal-annular projection portion 11c which projects downwardly.

The EB mask 15 is a so-called cell projection mask. So, the opening pattern 16a formed at the center portion of the mask 15 is a cell projection opening pattern, which corresponds to an extracted part of an exposure pattern. The opening pattern 16a of the mask 15 selectively transmits electrons of the electron beam, which is subjected to sectional-shape formation to provide a prescribed sectional shape in conformity with a shape of the opening pattern 15a.

Openings are formed at center portions of the apertures 12 and 17 respectively. So, the openings of the apertures 12 and 17 respectively transmit electrons of the electron beam, so that sectional-shape formations are respectively effected on the electron beam.

Incidentally, the electron-beam exposure system of the present embodiment is equipped with a selection deflector (not shown) at the crossover plane A, which deflects an electron beam onto the designated cell projection opening pattern 15a of the EB mask 15, as well as a positioning deflector (not shown) which deflects a contracted electron beam on a designated location on the semiconductor wafer W in accordance with exposure data transmitted from a computer (not shown).

With respect to the radiation surface 11a of the electron source 11, the zonal-annular projection portion 11c is formed to surround the center portion 11b. Therefore, electrons are easily output from tip ends of the zonal-annular projection portion 11c, which correspond to a periphery of the center portion 11b. Therefore, an electron beam is radiated mainly from such a periphery of the center portion 11b to have a ring shape in section. Thus, it is possible to obtain the electron beam in which a high electron density region having a ring shape lies in the section.

Figure 3:
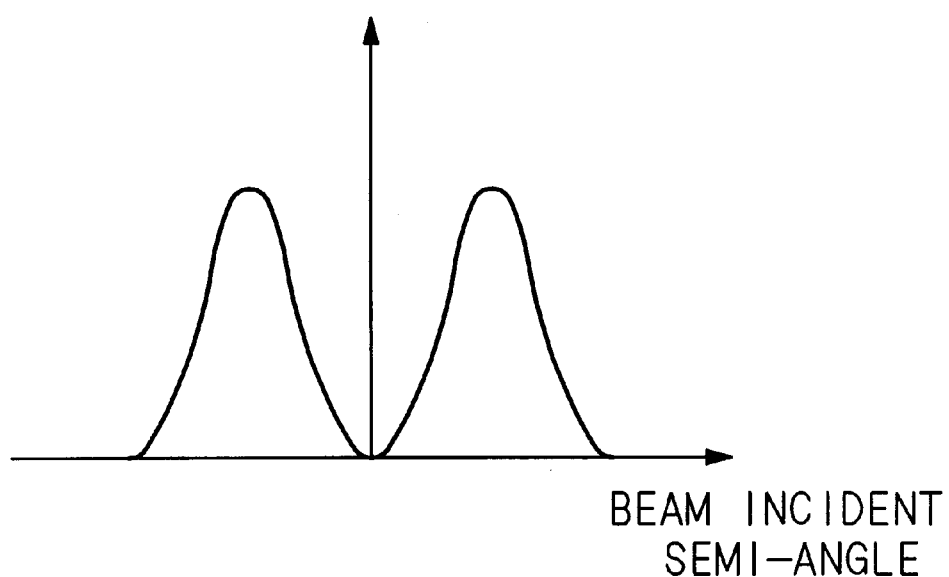
FIG. 3 is a graph showing a distribution of electron-beam intensities in connection with beam incident semi-angles of electron beams being incident on a semiconductor wafer.

Using the aforementioned electron source 11, it is possible to produce the electron beam in which electron-beam intensities are high in its periphery rather than its center portion. In other words, electron-beam densities are high in the periphery of the center portion 11b. The electron source 11 radiates electron beams, which are irradiated on the semiconductor wafer W and are distributed as shown in FIG. 3. That is, it is possible to provide a distribution in electron-beam intensities, as shown in FIG. 3, in connection with beam incident semi-angles by which the electron beams are irradiated on the semiconductor wafer W. Herein, the electron beams are distributed such that relatively high electron-beam intensities appear in a relatively broad range of beam incident semi-angles, which provides oblique illumination. In the case of the oblique illumination, the electron beams spread in a horizontal direction, in other words, beam incident semi-angle α becomes large, so that distances between electrons are increased. This weakens Coulomb interaction effect, so that the Coulomb effect is reduced.

Now, a description will be given with respect to a relationship between beam blur and beam incident semi-angle α. In general, beam blur $\delta_{ci}$ of the electron beam due to the Coulomb effect is given by a relational expression (1), as follows:

$$\delta_{ci} = \frac{IL}{\alpha E^{3/2}} \qquad (1)$$

where I denotes a beam current, L denotes a beam path length, α denotes a beam incident semi-angle (i.e., a half of a beam spread angle on the semiconductor wafer W), and E denotes acceleration voltage.

The aforementioned relational expression (1) shows that the beam blur $\delta_{ci}$ becomes small as the beam incident semi-angle α becomes large, so that the Coulomb effect is to be reduced. By appropriately increasing the beam incident semi-angle α, it is possible to reduce the beam blur $\delta_{ci}$, in other words, it is possible to increase resolution to be higher. So, it is possible to increase the beam current I.

It is possible to estimate a relationship between the beam current I and throughput (i.e., processing capability) in accordance with an equation (2), as follows:

$$T = \frac{I}{S \cdot A} \qquad (2)$$

where S denotes resist sensitivity, and A denotes a pattern effective area on the wafer.

The equation (2) shows that the throughput can be improved by increasing the beam current I.

Therefore, by using the electron source 11 having the zonal-annular projection portion 11c, it is possible to reduce the Coulomb effect, so it is possible to decrease the beam blur. In addition, it is possible to increase the beam current, so it is possible to improve the throughput.

Beam blur $\delta_{cr}$ due to chromatic aberration and beam blur $\delta_{sp}$ due to spherical aberration are given by equations (3) and (4), as follows:

$$\delta_{cr} = C_c \alpha \left(\frac{\Delta E}{E}\right) \qquad (3)$$

$$\delta_{sp} = \left(\frac{1}{2}\right) C_s \alpha^3 \qquad (4)$$

where $C_c$ denotes a coefficient of chromatic aberration, $C_s$ denotes a coefficient of spherical aberration. Incidentally, a value of energy spread, ΔE, depends on material of the electron source. In the case of $LaB_6$ of the present embodiment, ΔE is approximately 2.5 eV or so.

Total beam blur δ is given by sum of squares of the aforementioned aberrations in accordance with an equation (5), as follows:

$$\delta = (\delta_{ci}^2 + \delta_{cr}^2 + \delta_{sp}^2)^{1/2} \qquad (5)$$

The foregoing equations (3), (4) show that the beam blurs $\delta_{cr}$, $\delta_{sp}$ are increased by increasing the beam incident semi-angle α. The beam blur $\delta_{ci}$ being caused to occur due to Coulomb effect of the electron-beam exposure system of a mask projection type has a size belonging to a prescribed range of sizes (i.e., approximately 50–100 nm), which is greater than a size (e.g., 30 nm) of the typical beam blur due to the chromatic aberration as well as a size (e.g., 15 nm) of the typical beam blur due to the spherical aberration. It is possible to reduce the aforementioned aberrations by appropriate designs of lenses. Thus, it is possible to suppress the total beam blur by reducing the Coulomb effect, regardless of variations of the chromatic aberration and spherical aberration.

Figure 4A:
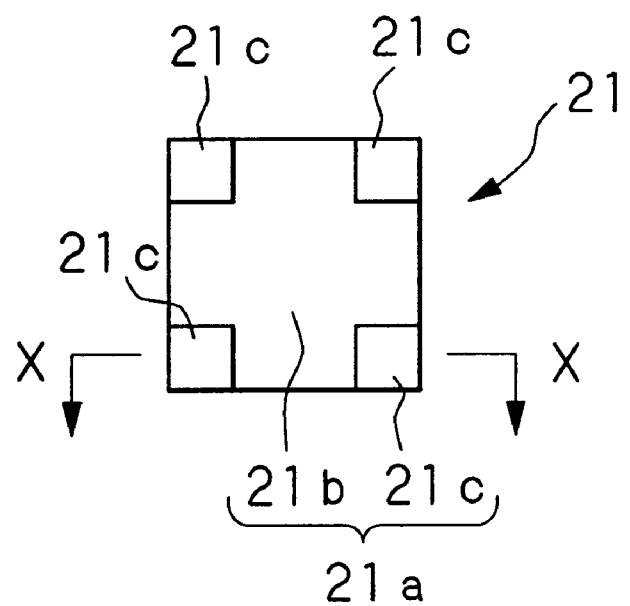
FIG. 4A is a front view showing an electron source being used in an electron-beam exposure system of embodiment 2 of the invention.
Figure 4B:
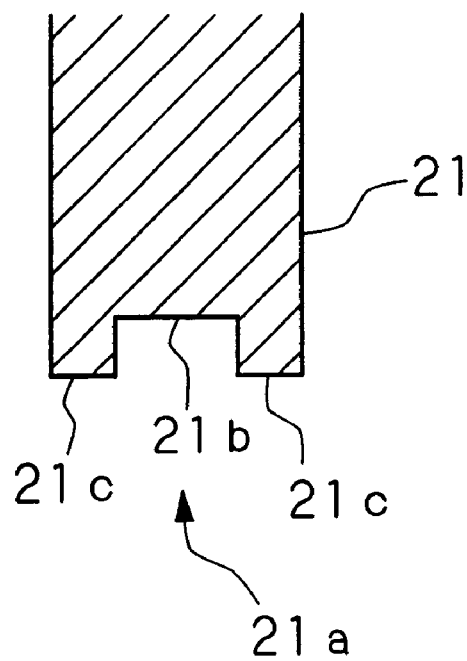
FIG. 4B is a sectional view taken along line X—X of FIG. 4A.

Next, an electron-beam exposure system of embodiment 2 will be described with reference to FIGS. 4A and 4B.

Different from the foregoing embodiment 1 using the electron source 11 in which the zonal-annular projection portion 11c is formed to surround the center portion 11b with respect to the radiation surface 11a, the embodiment 2 uses an electron source 21 in which unit projections "21c" are formed and scattered about a center portion 21b with respect to a radiation surface 21a. Specifically, the embodiment 2 forms four unit projections at four corners of the radiation surface 21a. Herein, each unit projection 21c has a tip end surface, which is formed in rectangle shape.

In the embodiment 2, each of the unit projections 21c radiates electrons from a tip end thereof. Thus, it is possible to form high electron density areas surrounding a center area in a section of an electron beam being irradiated from the electron source 21. Like the foregoing embodiment 1, the embodiment 2 is capable of performing oblique illumination.

Incidentally, the present embodiment uses the four unit projections 21c, which are separatedly arranged in periphery of the center portion 21b with respect to the radiation surface 21a. It is necessary to form multiple unit projections. However, a number of the unit projections is not limited to four, so it is possible to form two, three, five or more unit projections in the electron source.

Next, an electron beam exposure device of embodiment 3 will be described with reference to FIG. 5.

The embodiment 3 is basically similar to the foregoing embodiment 1 shown in FIG. 1. Different from the embodiment 1 of FIG. 1 in which the zonal-annular projection portion 11c is formed to surround the center portion 11b with respect to the radiation surface 11a of the electron source 11 while a simple opening is formed at a center portion of the objective aperture 17, the embodiment 3 of FIG. 5 employs the aforementioned electron source 1, which is the general square surface electron source, as well as a modified object aperture 31 in which a center shield member 31a is formed to prevent electrons, corresponding to a center portion of a section of an electron beam, from transmitting therethrough. In addition, the center shield member 31a allows electrons, corresponding to a periphery portion of the section of the electron beam, to transmit through the modified object aperture 31.

Figure 6:
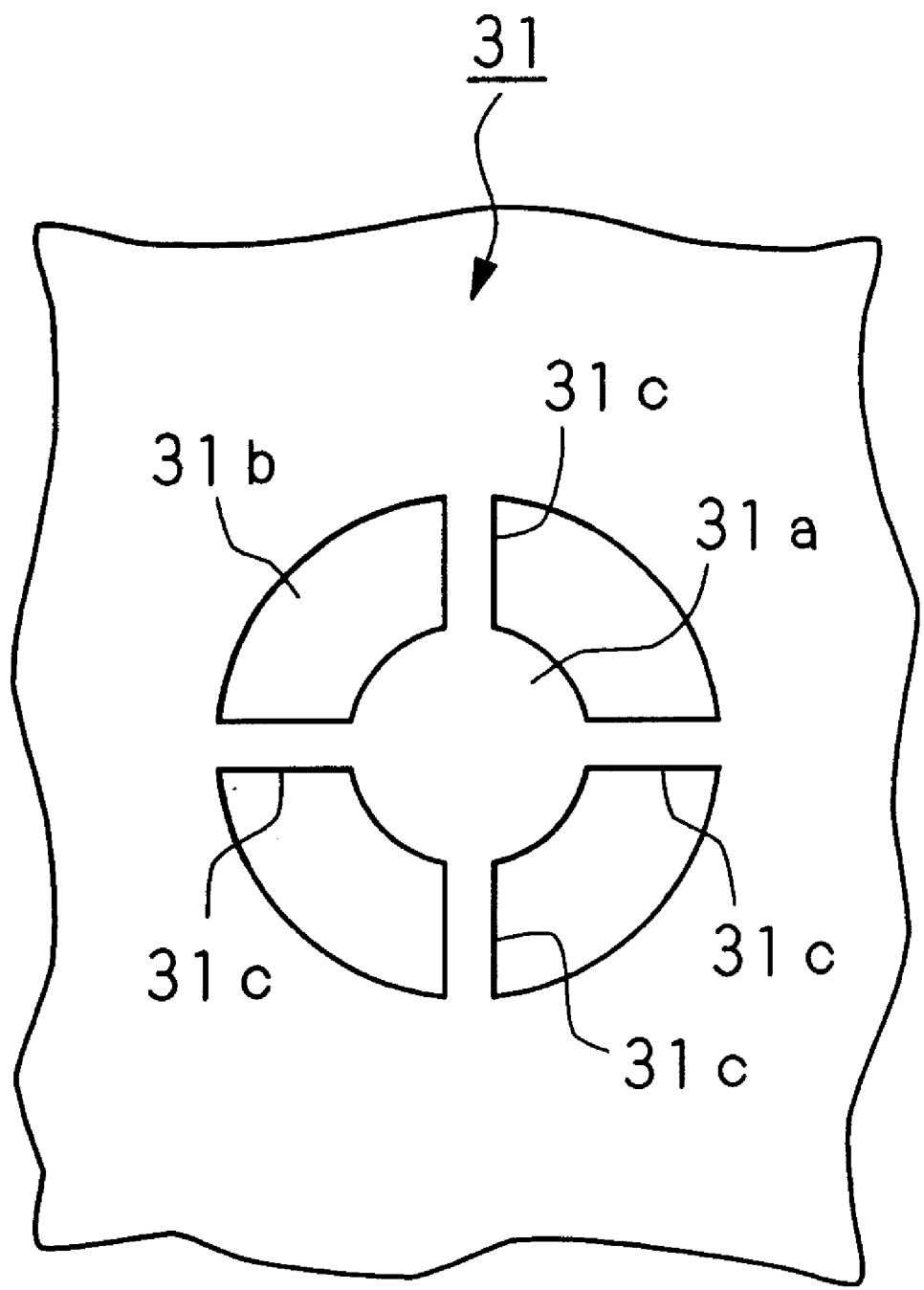
FIG. 6 is a plan view showing essential parts of a modified object aperture used in the electron-beam exposure system of the embodiment 3.

The modified object aperture 31 is arranged at the crossover plane C of the electron optics. As shown in FIG. 6, the center shield member 31a having a circular shape is formed at the center portion of the modified object aperture 31. Herein, a ring opening portion 31b, which consists of (four) circular-arc openings, is formed to surround the center shield member 31a. Incidentally, a periphery end portion of the center shield member 31a is supported by (four) rib portions 31c.

The center shield member 31a prevents electrons having relatively small beam incident semi-angles, corresponding to the center portion of the section of the electron beam, from transmitting therethrough, while the ring opening portion 31b selectively allows electrons having relatively large beam incident semi-angles, corresponding to peripheral portions of the section of the electron beam, to transmit therethrough. Thus, by the provision of the modified object aperture 31 having the center shield member 31a, it is possible to perform oblique illumination with respect to an image surface.

The embodiment 3 employs the square surface electron source as the electron source 1, however, it is not necessary to limit usage of the electron source. For example, the embodiment 3 can be modified by using the electron source 11 of the embodiment 1 or the electron source 21 of the embodiment 2. Using the electron source 11 or 21 together with the modified object aperture 31 offer a synergistic effect in illumination. Thus, it is possible to obtain excellent oblique illumination of high efficiency.

Figure 5:
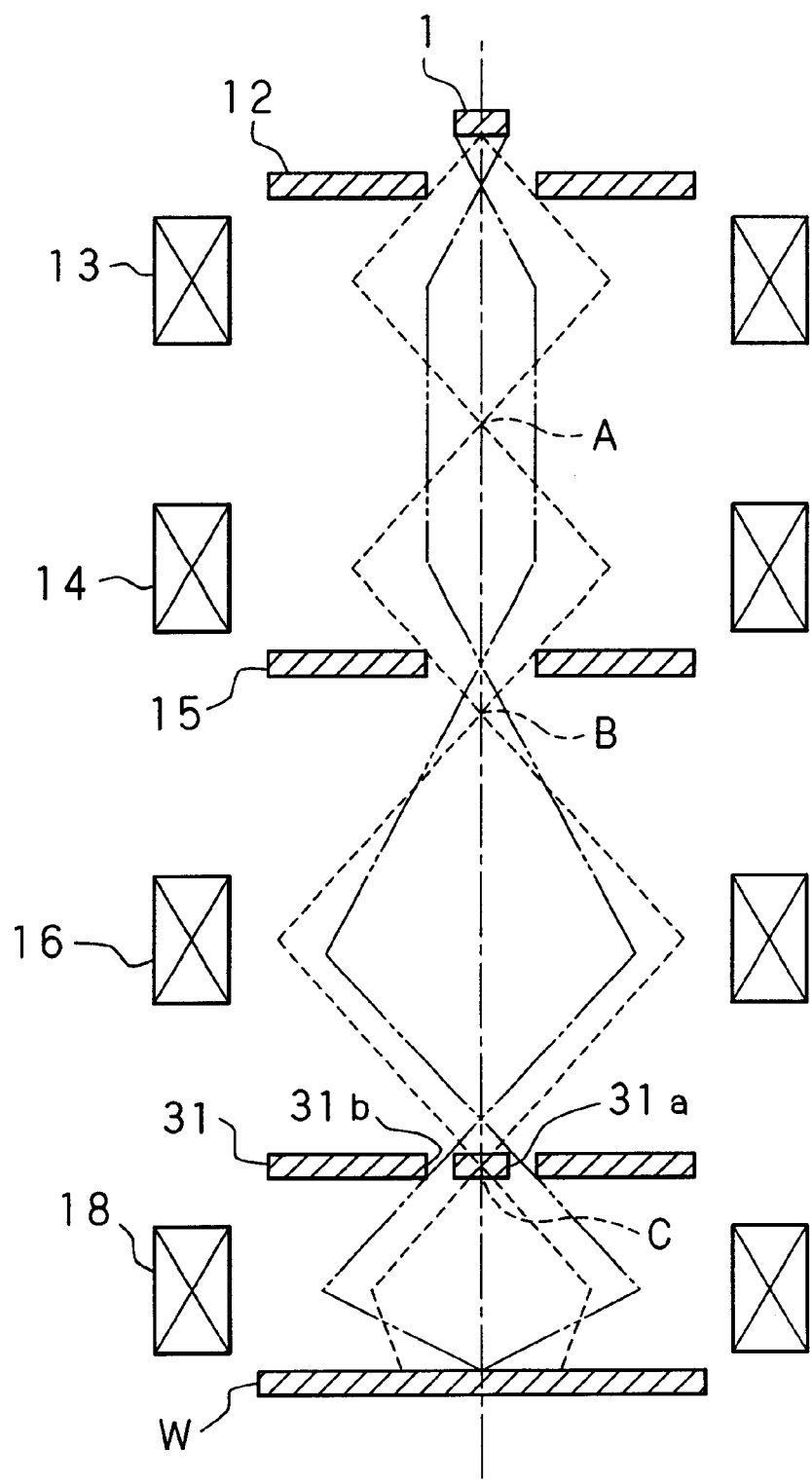
FIG. 5 is an exploded elevational view partially in section showing an electron-beam exposure system in accordance with embodiment 3 of the invention.

The embodiment 3 of FIG. 5 is characterized by using the modified object aperture 31 in which the ring opening portion 31b is formed to surround the center shield member 31a. It is necessary to form an opening portion surrounding the center shield member 31a. However, such an opening portion is not necessarily formed in a ring shape. For example, it is possible to form through holes penetrating through the modified object aperture 31 at selected positions, which are scattered about the center shield member 31a. Or, it is possible to form the opening portion in a square shape.

The modified object aperture 31 prevents electrons, corresponding to the center portion of the section of the electron beam which transmits through the opening pattern 15a of the EB mask 15, from transmitting therethrough. Incidentally, both of the electrons, which transmits through he modified object aperture 31, and the electrons, which the modified object aperture 31 prevents from transmitting, are transmitting electrons of a transmission mask. That is, the modified object aperture 31 is not used under the condition where the EB mask corresponds to a scattering mask (i.e., so-called SCALPEL mask where "SCALPEL" is an abbreviation for "Scattering with Angular Limitation in Projection Electron-Beam Lithography") which makes contrasts based on differences in scattering degrees of electrons. In other words, the modified object aperture 31 is quite different in shape, dimensions and functions from the aperture that selectively transmits only the greatly scattered electrons within the scattering electrons.

Figure 7:
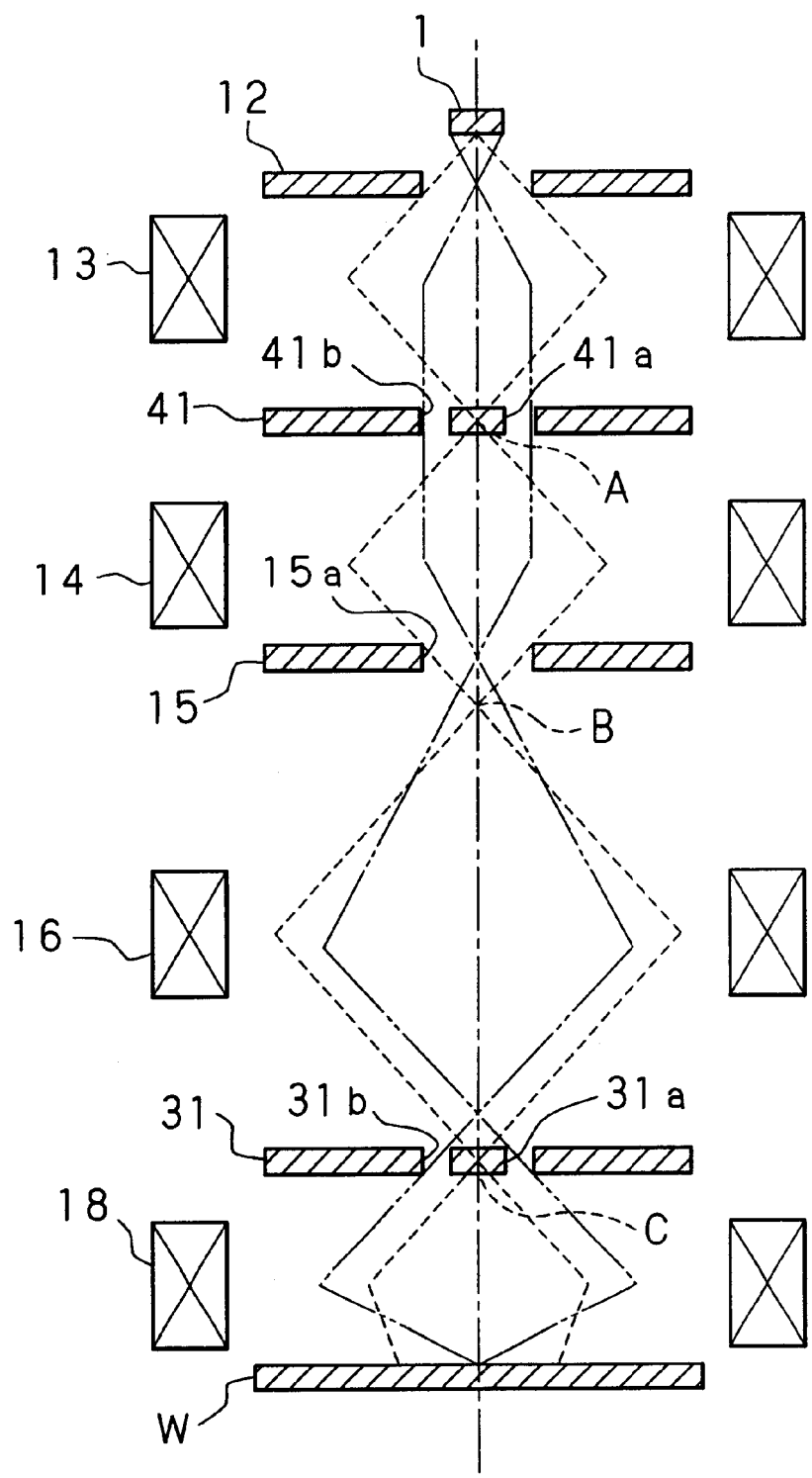
FIG. 7 is an exploded elevational view partially in section showing an electron-beam exposure system in accordance with embodiment 4 of the invention.

Next, an electron-beam exposure system of embodiment 4 will be described with reference to FIG. 7.

The embodiment 4 is basically similar to the aforementioned embodiment 3, however, the embodiment 4 is different from the embodiment 3 of FIG. 5 in which a single modified object aperture (31) is arranged at the third crossover plane C. That is, the embodiment 4 is characterized by providing two modified object apertures 31 and 41. Specifically, the first modified object aperture 31 is arranged at the third crossover plane C, while the second modified object aperture 41 having a center shield member 41a is arranged at the first crossover plane A.

Like the modified object aperture 31 having the center shield member 31a, the second modified object aperture 41 has the center shield member 41a having a circular shape, which is formed and arranged to prevent electrons, corresponding to a center portion of a section of an electron beam, from transmitting therethrough. In addition, a ring opening portion 41b consisting of multiple circular-ark openings is formed and arranged to surround the center shield member 41a. Further, periphery of the center shield member 41a is supported by rib portions (not shown). Incidentally, the shape of the opening portion 41b surrounding the center shield member 41a is not limited to the ring shape or zonal-annular projection shape. So, the opening portion can be formed in a square shape or else.

The electron-beam exposure system of the embodiment 4 arranges the two modified object apertures before and after the EB mask 15. Like the first modified object aperture 31, the second modified object aperture 41 cuts off electrons, corresponding to the center portion of the section of the electron beam, by the center shield member 41a while selectively transmitting electrons, corresponding to peripheral portions of the electron beam, by the ring opening portion 41b. So, as compared with the embodiment 3, the embodiment 4 is capable of performing the oblique illumination in a more oblique manner.

Incidentally, it is possible to modify the embodiment 4 such that the modified object aperture 31 is replaced with the conventional object aperture while the second modified object aperture 41 remains. In that case, the second modified object aperture 41 cuts off electrons, corresponding to the center portion of the section of the electron beam, while selectively transmitting electrons, corresponding to the peripheral portions of the section of the electron beam. Such electron beam containing electrons, which the second modified object aperture 41 selectively transmits, is incident on the EB mask 15. Then, the electron beam which transmits through the mask 15 is irradiated on the semiconductor wafer W. Thus, the modification of the embodiment 4 is also capable of performing the oblique illumination as similar to the foregoing embodiment 3.

Figure 8:
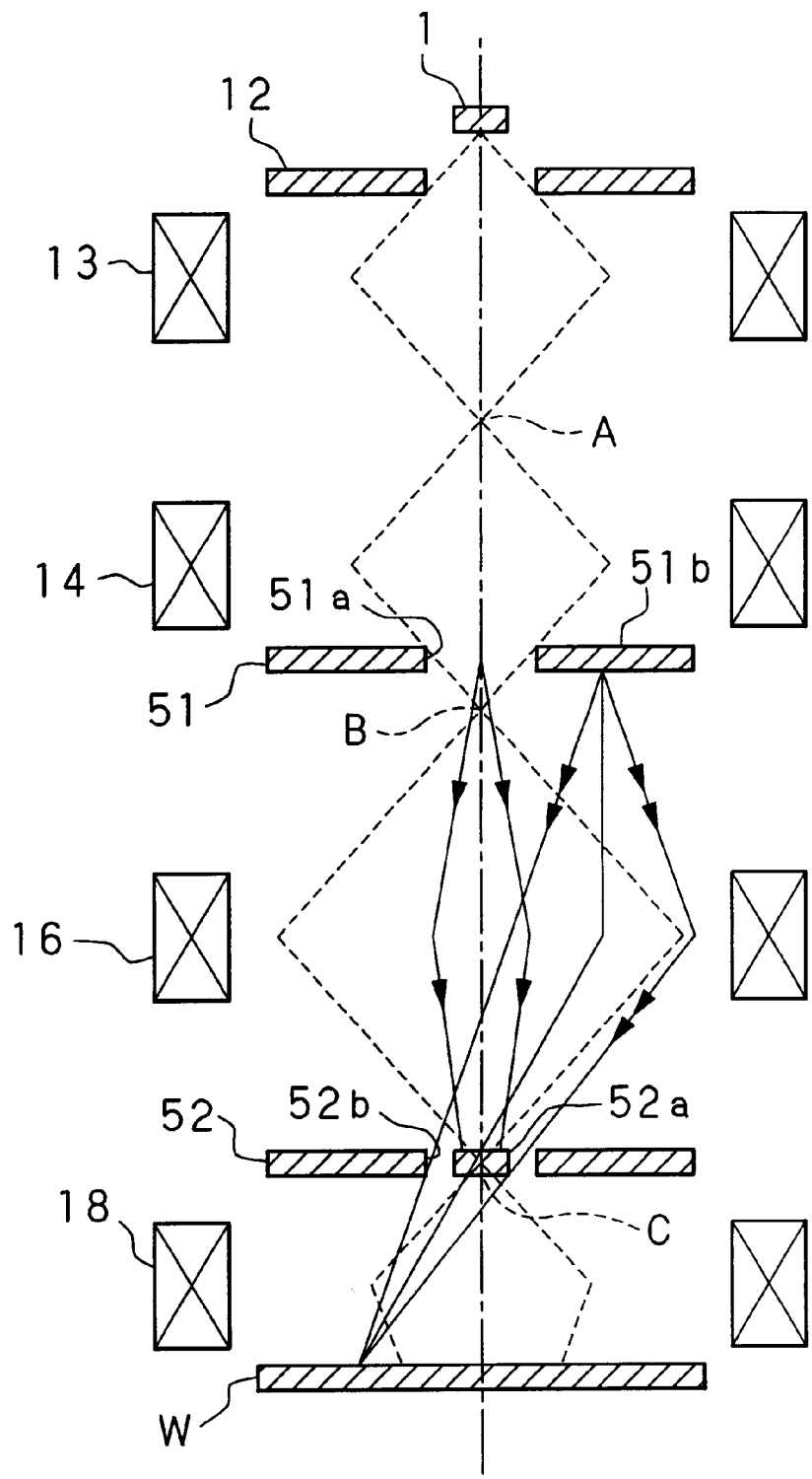
FIG. 8 is an exploded elevational view partially in section showing an electron-beam exposure system in accordance with embodiment 5 of the invention.
Figure 9:
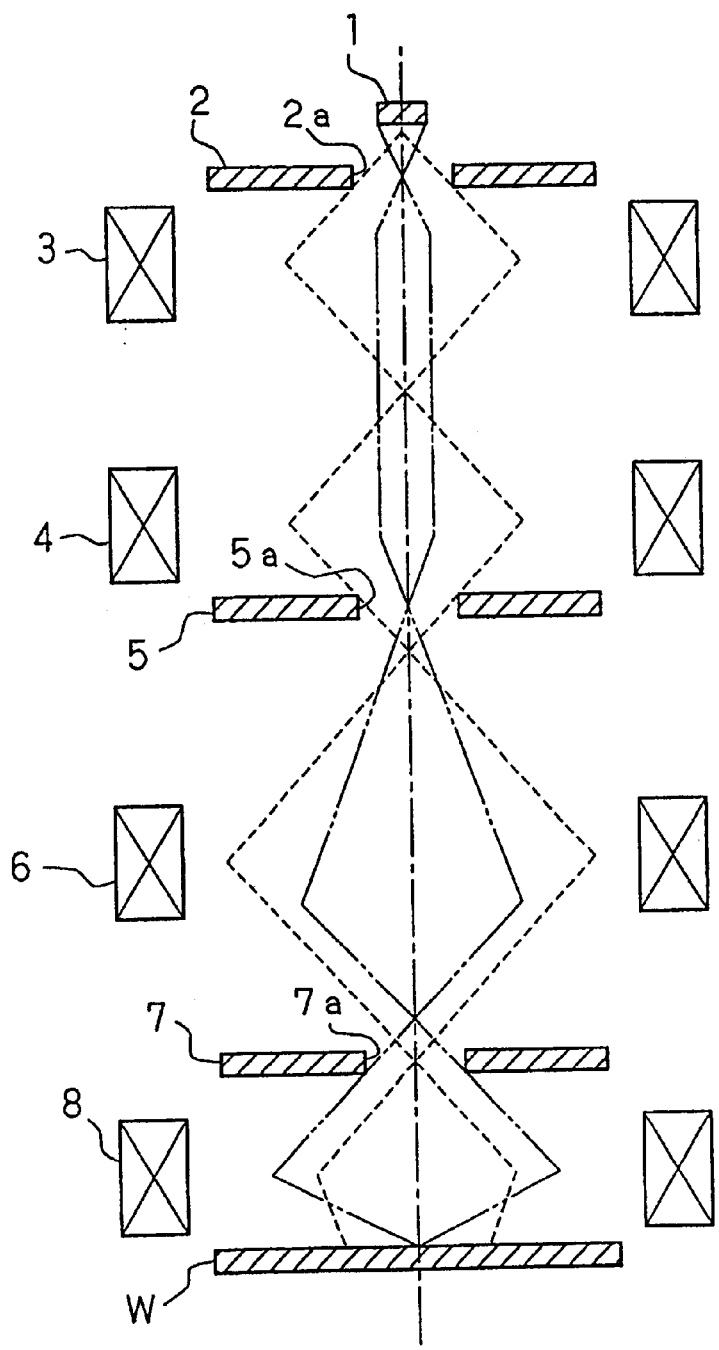
FIG. 9 is an exploded elevational view partially in section with respect a conventional example of the electron-beam exposure system.
Figure 10A:
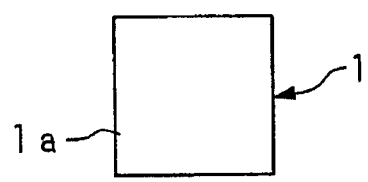
FIG. 10A is a front view showing an example of a radiation surface of an electron source shown in FIG. 9.
Figure 10B:
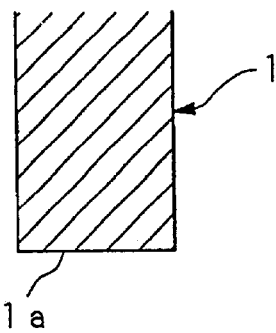
FIG. 10B is a sectional view of the electron source of FIG. 10A.
Figure 11A:
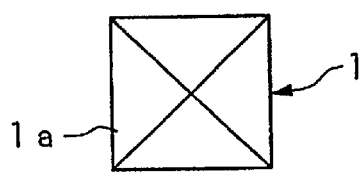
FIG. 11A is a plan view showing another example of a radiation surface of the electron source.
Figure 11B:
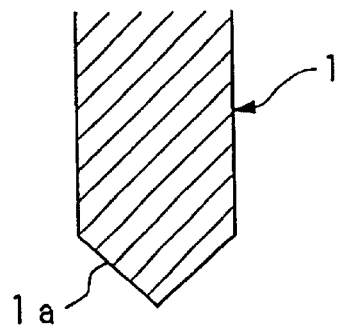
FIG. 11B is a sectional view of the electron source of FIG. 11A.
Figure 12:
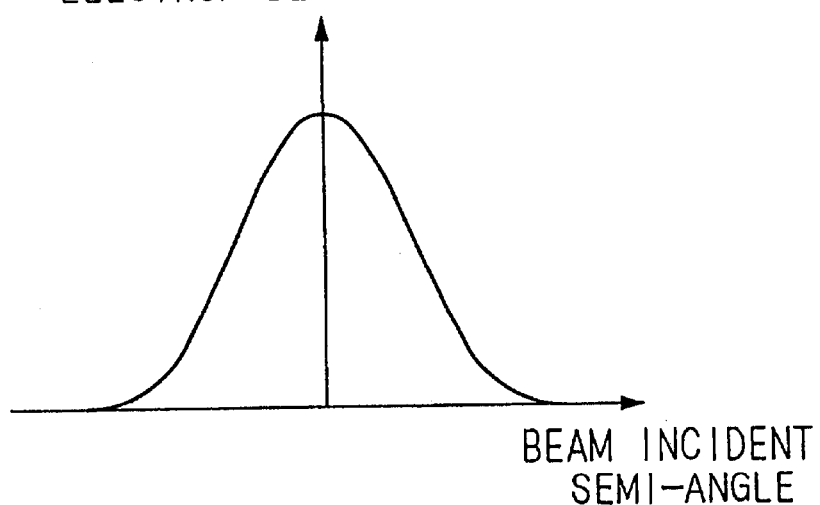
FIG. 12 is a graph showing a distribution of electron-beam intensities of electron beams in connection with beam incident semi-angles of electron beams being incident on a substrate.

Next, an electron-beam exposure system of embodiment 5 will be described with reference to FIG. 8. The embodiment 5 is basically similar to the foregoing embodiment 3, however, it is different from the embodiment 3 of FIG. 5. The embodiment 3 uses the EB mask 15 corresponding to the transmission mask, and the modified object aperture 31, which cuts off electrons, corresponding to the center portion of the section of the electron beam transmitting through the EB mask 15, while selectively transmitting electrons corresponding to the peripheral portions of the section of the electron beam. In contrast to the embodiment 3, the embodiment 5 of FIG. 8 is characterized by using an EB mask 51 and a modified object aperture 52, which are arranged at the second crossover plane B and third crossover plane C respectively. Herein, the EB mask 51 corresponds to a thin-film stencil mask, on which a pattern is formed by an opening portion 51a and a thin-film scattering member 51b. The opening 51a transmits electrons of an incoming electron beam of the mask 51 while the thin-film scattering member 51b transmits scattering electrons, which are caused to occur by scattering electrons of the electron beam. In addition, the modified object aperture 52 is equipped with a center shield member 52a which cuts off electrons corresponding to a center portion of a section of its incoming electron beam while selectively transmitting electrons corresponding to periphery of the center portion of the electron beam.

As described above, the center shield member 52a having a circular shape is formed at a center portion of the modified object aperture 52. In addition, a ring opening portion 62b consisting of circular-arc openings is formed and arranged to surround the center shield member 52a. Incidentally, the periphery of the center shield member 52a is supported by rib portions (not shown).

The thin-film scattering member 51b of the EB mask 51 is made of a super thin film whose thickness is approximately several micro meters (μm) or so. Thus, electrons of the electron beam being irradiated onto the mask 51 are scattered with relatively large scattering angles as scattering electrons.

The present embodiment is designed to use differences between transmitting electron beam and mask-scattered electron beam, beam incident semi-angles of which greatly differ from each other. Herein, the center shield member 52a of the modified object aperture 52 cuts off electrons of the transmitting electron beam, while the ring opening portion 62b corresponding to the periphery of the center shield member 52a selectively transmits electrons of the mask-scattered electron beam. Thus, a certain image is formed on the semiconductor wafer W. Therefore, as compared with the electron-beam exposure system by which image formation is made directly using the transmitting electron beam, the present embodiment is capable of broadening a range of the beam so that the beam incident semi-angle α is correspondingly increased. Thus, it is possible to reduce the Coulomb effect.

As compared with the modified object aperture 31 of the embodiment 3 which selectively cuts off electrons corresponding to the center portion of the section of the transmitting electron beam, the modified object aperture 52 of the embodiment 5 cuts off all electrons of the transmitting electron beam. Therefore, the modified object aperture 52 is functionally different from the aforementioned modified object aperture 31.

In addition, the modified object aperture 52 of the embodiment 5 transmits a whole part of the mask-scattered electron beam. So, it is functionally different from the aperture which selectively transmits electrons of the mask-scattered electron beam in response to its scattering degree. Therefore, as compared with the aperture which transmits a part of the mask-scattered electron beam for image formation, the modified object aperture 52 of the embodiment 5 is capable of effectively using a whole part of the mask-scattered electron beam, regardless of its scattering degree. So, the whole part of the mask-scattered electron beam contributes to the image formation.

The aforementioned embodiments can be modified within the scope of the invention, as follows:

The embodiments 1 and 2 are designed such that the electron beams radiated from the electron sources 11 and 12 are irradiated onto the EB mask 15, which corresponds to the transmission mask. However, it is not necessary to use the transmission mask for the EB mask 15. That is, it is possible to use other types of the masks. For example, instead of the EB mask 15 corresponding to the transmission mask, it is possible to use the aforementioned scattering mask of the embodiment 3 and the aforementioned thin-film stencil mask of the embodiment 5 in the embodiments 1 and 2.

Lastly, this invention has a variety of technical features and effects, which are summarized as follows:

(1) The electron-beam exposure system uses an electron source to radiate electrons in form of an electron beam, which is controlled to have a specific electron-beam intensity distribution in section. That is, electrons corresponding to periphery of the section of the electron beam is set higher in intensity than electrons corresponding to a center portion of the section of the electron beam. This increases electron densities in the periphery of the section of the electron beam, so that the device is capable of performing oblique illumination on a semiconductor substrate. Herein, the electron beam is broadened in a horizontal direction, so that an average distance between electrons is increased as well. So, it is possible to reduce Coulomb effect, while it is possible to increase a beam current. Thus, it is possible to improve resolution in image formation on the substrate as well as throughput of integrated circuits.

(2) The electron-beam exposure system uses an electron beam having a special design, in which a projection portion is formed to surround a center portion with respect to a radiation surface for radiating electrons. Therefore, the electrons are mainly radiated from periphery of the center portion of the radiation surface of the electron source. So, it is possible to obtain an electron beam, in which electron densities are raised in periphery rather than a center portion in section. Thus, it is possible to perform oblique illumination on the substrate on which the electron beam is incident in an oblique manner.

(3) The electron source of the electron-beam exposure system is designed such that the projection portion is formed in a zonal annular shape, which is formed about the center portion of the radiation surface. Therefore, it is possible to obtain an electron beam having a section, in which a high electron density area lies in a ring shape. Using such an electron beam, it is possible to perform zonal-annular oblique illumination on the substrate, on which the electron beam is incident in an oblique manner with a zonal annular shape.

(4) The electron source of the electron-beam exposure system is designed such that the projection portion is constructed by a number of unit projections, which are scattered about the center portion of the radiation surface. Herein, electrons are radiated from a tip end of each unit projection. Therefore, a number of high electron density areas are scattered in periphery of the center portion of the section of the electron beam. Using such an electron beam, it is possible to perform the oblique illumination with ease.

(5) The electron-beam exposure system is designed such that a center shield member is arranged at the crossover plane of electrons. The center shield member cuts off electrons corresponding to the center portion of the section of the electron beam while transmitting electrons corresponding to periphery of the section of the electron beam. That is, the center shield member cuts off the electrons having relatively small beam incident semi-angles, which correspond to the center portion of the section of the electron beam, while selectively transmitting the electrons having relatively large beam incident semi-angles, which correspond to the periphery of the section of the electron beam. This increases a ratio of the electrons of the electron beam which contribute to the oblique illumination. Thus, it is possible to reduce the Coulomb effect.

(6) The electron-beam exposure system uses an EB mask corresponding to a transmission mask on which a specific pattern is formed by an opening portion for selectively transmitting electrons and a shield member for cutting off electrons. In addition, a center shield member is arranged at one crossover plane of electrons to cut off electrons, corresponding to the center portion of the section of the electron beam, while transmitting electrons corresponding to the periphery of the section of the electron beam. So, within electrons being transmitted through the transmission mask or transmitting electrons, the center shield member cuts off electrons having relatively small beam incident semi-angles, corresponding to the center portion of the section of the electron beam, while selectively transmitting electrons having relatively large beam incident semi-angles corresponding to the periphery of the section of the electron beam. Using such electron beam, it is possible to perform the oblique illumination with respect to the object plane or image surface. Thus, it is possible to reduce the Coulomb effect with ease.

(7) The electron-beam exposure system uses an EB mask corresponding to a thin-film stencil mask on which a specific pattern is formed by an opening portion for transmitting electrons and a thin-film scattering member for transmitting scattering electrons which are caused by scattering electrons. In addition, the system arranges a center shield member at one crossover plane of electrons between the EB mask and substrate. The center shield member cuts off electrons corresponding to the center portion of the section of the electron beam while selectively transmitting electrons corresponding to the periphery of the section of the electron beam. The center shield member cuts off only the transmitting electrons. In contrast, the scattering electrons are not cut off and are used for image formation by beams having a broad range of beam incident semi-angles.

Specifically, the mask-scattered electron beam of the scattering electrons has a greater beam incident semi-angle and a larger size than the electron beam of the transmitting electrons. This increases an average distance between the electrons of the electron beam. Thus, it is possible to weaken Coulomb interaction effect.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. An electron-beam exposure system comprising:

an electron source for radiating electrons in form of an electron beam; and an electron-beam mask for selectively transmitting the electrons of the electron beam, which is irradiated on a substrate and which exposes a pattern of the electron-beam mask on the substrate, wherein the electron source has a radiation surface for radiating the electrons, and wherein a projection portion is formed to surround a recessed center portion of the radiation surface such that a periphery section of the electron beam has a higher intensity than a center portion section of the electron beam.

2. An electron-beam exposure system according to claim 1, wherein the projection portion is formed in a zonal annular shape which is formed about the center portion of the radiation surface.

3. An electron-beam exposure system according to claim 1, wherein the projection portion is formed by a plurality of unit projections, which are arranged to surround the center portion of the radiation surface.

4. An electron-beam exposure system according to claim 1, wherein a center shield member is arranged at least one crossover plane of the electrons being radiated from the electron source so as to cut off electrons, corresponding to the center portion section of the electron beam, while selectively transmitting electrons corresponding to the periphery section of the electron beam.

5. An electron-beam exposure system comprising:

an electron source for radiating electrons in form of an electron beam, wherein the electron source has a radiation surface for radiating the electrons, and wherein a projection portion is formed to surround a recessed center portion of the radiation surface;

an electron-beam mask for selectively transmitting the electrons of the electron beam, which is irradiated on a substrate and which exposes a pattern of the electron-beam mask on the substrate, wherein the electron-beam mask corresponds to a transmission mask in which the pattern is formed by an opening portion for selectively transmitting the electrons of the electron beam and a shield member for cutting off a part of the electros of the electron beam; and a center shield member being arranged at least one crossover plane of the electrons radiated from the electron source, wherein the center shield member cuts off electrons corresponding to a center portion section of the electron beam while selectively transmitting electrons corresponding to a periphery section of the electron beam.

6. An electron-beam exposure system comprising:

an electron source for radiating electrons in form of an electron beam wherein the electron source has a radiation surface for radiating the electrons, and wherein a projection portion is formed to surround a recessed center portion of the radiation surface;

an electron-beam mask for selectively transmitting the electrons of the electron beam, which is irradiated on a substrate and which exposes a pattern of the electron-beam mask on the substrate, wherein the electron-beam mask corresponds to a thin-film stencil mask in which the pattern is formed by an opening portion for selectively transmitting the electrons of the electron beam and a thin-film scattering member for selectively transmitting scattered electrons, which are caused by scattering the electrons of the electron beam; and a center shield member being arranged at least one crossover plane of the electrons between the electron-beam mask and the substrate, wherein the center shield member cuts off electrons corresponding to a center portion section of the electron beam while selectively transmitting electrons corresponding to a periphery section of the electron beam.

7. An electron-beam exposure system comprising:

an electron source for radiating electrons in form of an electron beam wherein the electron source has a radiation surface for radiating the electrons, and wherein a projection portion is formed to surround a recessed center portion of the radiation surface;

a first aperture for forming the electronic beam to have a rectangular shape in section;

a first electromagnetic lens for performing convergence on the electron beam, which transmits through the first aperture, to form a first crossover plane of the electrons;

a second electromagnetic lens for performing convergence on the electron beam, which passes through the first electromagnetic lens, to form a second crossover plane of the electrons;

an electron-beam mask having an opening portion for selectively transmitting the electrons of the electron beam, which passes through the second electromagnetic lens, to impart a prescribed pattern to the electron beam, wherein the electron-beam mask is arranged in proximity to the second crossover plane;

a third electromagnetic lens for performing convergence on the electron beam, which transmits through the electron-beam mask, to form a third crossover plane of the electrons;

a third aperture corresponding to an object aperture for selectively transmitting the electrons of the electronic beam, which passes through the third electromagnetic lens, to narrow down the electron beam; and a fourth electromagnetic lens for performing convergence on the electron beam which transmits through the third aperture, so that the electron beam is irradiated on a substrate as oblique illumination.

8. An electron-beam exposure system according to claim 7, wherein the electron source is constructed by a crystal of $LaB_6$.

9. An electron-beam exposure system according to claim 7, wherein the projection portion is formed in a zonal-annular shape which is formed about the center portion of the radiation surface.

10. An electron-beam exposure system according to claim 7, wherein the projection portion is formed by a plurality of unit projections which are arranged to surround the center portion of the radiation surface.

11. An electron-beam exposure system according to claim 7, wherein the third aperture corresponds to a modified object aperture having a center shield member, which cuts off electrons corresponding to a center portion of a section of the electron beam, and a ring opening portion which selectively transmits electrons corresponding to a periphery of the section of the electron beam.

12. An electron-beam exposure system according to claim 11, wherein the ring opening portion is constructed by a plurality of circular-arc openings, which are arranged to surround the center shield member.

13. An electron-beam exposure system according to claim 11 further comprising a second modified object aperture having a center shield member, which cuts off electrons corresponding to the center portion of the section of the electron beam, and a ring opening portion which selectively transmits electrons corresponding to the periphery of the section of the electron beam, wherein the second modified object aperture is arranged in proximity to the first crossover plane.

14. An electron-beam exposure system according to claim 7, wherein the electron-beam mask corresponds to a thin-film stencil mask having an opening portion for selectively transmitting electrons of the electron beam and a thin-film scattering member for selectively transmitting scattering electrons, which are caused by scattering the electrons of the electron beam.

15. An electron-beam exposure system according to claim 14, wherein the third aperture corresponds to a modified object aperture having a center shield member which cuts off electrons corresponding to a center portion of a section of the electron beam while selectively transmitting electrons corresponding to a periphery of the section of the electron beam.

* * * * *